United States Patent
Amer et al.

(10) Patent No.: US 6,893,986 B2
(45) Date of Patent: May 17, 2005

(54) METHOD OF REDUCING INTERNAL STRESS IN MATERIALS

(75) Inventors: Maher S. Amer, Xenia, OH (US); John F. Maguire, Bellbrook, OH (US)

(73) Assignee: Wright State University, Dayton, OH (US)

( * ) Notice: Subject to any disclaimer, the term of this patent is extended or adjusted under 35 U.S.C. 154(b) by 0 days.

(21) Appl. No.: 10/624,427

(22) Filed: Jul. 22, 2003

(65) Prior Publication Data

US 2004/0137663 A1 Jul. 15, 2004

Related U.S. Application Data

(60) Provisional application No. 60/397,730, filed on Jul. 22, 2002.

(51) Int. Cl.[7] .............................................. H01L 21/26
(52) U.S. Cl. ...................... 438/795; 438/652; 438/800; 438/938
(58) Field of Search ................................ 438/652, 761, 438/780, 795, 800, 938

(56) References Cited

U.S. PATENT DOCUMENTS

| | | |
|---|---|---|
| 6,037,420 A | 3/2000 | Tochioka |
| 6,134,049 A | 10/2000 | Spiller et al. |
| RE38,072 E * | 4/2003 | Kondo et al. ................. 438/47 |
| 6,555,462 B2 | 4/2003 | Ahn et al. |
| 6,768,857 B2 * | 7/2004 | Bona et al. ................. 385/129 |
| 2001/0035585 A1 | 11/2001 | Ahn et al. |
| 2003/0024904 A1 | 2/2003 | Clauer et al. |
| 2003/0024915 A1 | 2/2003 | Clauer et al. |

OTHER PUBLICATIONS

Amer et al., Induced stresses and structural changes in silicon wafers as a result of laser micro–machining, Applied Surface Science 187 (2002) 291–296.

* cited by examiner

Primary Examiner—Amir Zaragian
Assistant Examiner—Christy Novacek
(74) Attorney, Agent, or Firm—Dinsmore & Shohl LLP (57) ABSTRACT

Methods are provided for adjusting and controlling the stress between layers of material in a multilayer structure. A first stress is configured in a region of stress on the substrate material. A second material is then deposited over the substrate. A second stress results between the substrate and the second material such that a net stress results where the net stress is a function of said first and second stresses. As such, the first stress can be configured to achieve a predetermined, desired net stress. For example, the first stress can be configured to cancel out the second stress such that the net stress is substantially zero.

22 Claims, 4 Drawing Sheets

METHOD OF REDUCING INTERNAL STRESS IN MATERIALS

CROSS REFERENCE TO RELATED APPLICATIONS

This application claims the benefit of U.S. Provisional Application No. 60/397,730 filed Jul. 22, 2002, which is incorporated herein by reference.

BACKGROUND

The present invention relates in general to methods of controlling stress in materials, and in particular to methods of controlling internal and interfacial stresses between adjacent layers in multilayer structures.

Figure 1:
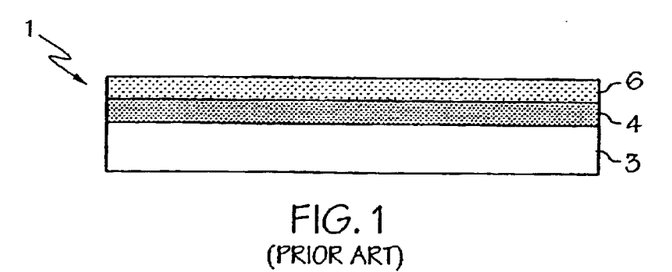
FIG. 1 is a schematic illustration of a multilayer material with a stress region.

When two dissimilar materials are placed in intimate contact with one another, such contact may give rise to stresses, particularly at the interface between the materials. This is illustrated in FIG. 1 where a multilayer material structure 1 is shown having a substrate material 3 that is bonded or joined in contact with a second material 6 using a technique such as vacuum deposition, pulsed laser deposition (PLD), chemical vapor deposition (CVD), or other known technique. The intimate contact between the substrate and second material 3, 6 gives rise to internal stresses, schematically illustrated as a stressed region 4. The stressed region 4 may arise by virtue of the inherent equilibrium properties of the dissimilar materials. The stressed region 4 may also arise as a response to externally applied fields such as temperature and pressure. In either respect, the imbalance of internal compressive or tensile stresses may cause problems in the multilayer material structure 1 such as cracks, delamination, surface defects, voids or degraded electrical or optical qualities or performance.

In view of the above problems, attempts have been made to control or eliminate the stress between two dissimilar materials. However, the majority of these attempts utilize an inter-coating or a buffer layer to provide a smooth gradient that ameliorates stress build-up at the interface between the materials. The inter-coating or buffer layer typically attempts to produce an opposite stress to the stress expected due to bonding of the materials, thereby partially canceling the stress. One problem with using an extra inter-coating or a buffer layer is that it takes additional time, space and materials to deposit the extra coating or buffer layer, thereby reducing manufacturing efficiency. In addition, the extra coating or layer may negatively affect the performance of the device in which the materials are used. Still further, it may not be possible to exactly match the undesired stress fields so that the approach may be only partially successful.

One attempt to control the internal stress between two dissimilar materials without the need of an extra coating or layer is described in U.S. Pat. No. 6,134,049 to Spiller et al. Spiller teaches a method of adjusting multilayer film stress induced deformation of optics so that stresses between layers are canceled without depositing an extra coating or layer on or in the film. Essentially, first and second layers of an overall multilayer optical structure must be selected among materials that exhibit both the property of generally equal and opposite stresses and the property that the first and second portions have optical constants that allow good reflectivity at a design wavelength. Thus, the manner in which the layers can be configured is limited. The first and second portion materials must be selected to have opposite stresses in order to produce a net film stress of zero. As such, only a negative stress material can be placed over a positive stress material. Still further, the layers must have optical constants that allow satisfactory reflectivity at a design wavelength.

Another approach to controlling the internal stress between to two dissimilar materials is taught in U.S. Pat. No. 6,037,420 to Tochioka. Tochioka teaches reducing the stress of materials by chemically placing an additive in a matrix at the molecular level. One disadvantage of this method is that the structure must be chemically altered which may affect the properties of the material and may not be desirable.

Thus, there is a need in the art for a method that will control the stress between two dissimilar materials that eliminates the need for extra coatings or layers, and allows for versatility in the types of materials used and the configuration of the materials. In addition, there is a need in the art for a method of controlling the stress between two dissimilar materials that is economically efficient and does not degrade the performance of the materials.

SUMMARY OF THE INVENTION

The present invention allows for the formation of multilayer structures that overcome the disadvantages of previous multilayer structures by providing methods for controlling the stress caused by bonding or joining materials in adjacent layers.

In an embodiment of the present invention, a method of creating a multilayer material structure is provided by configuring a first region of stress in a first, or substrate material, and depositing a layer of a second material over the substrate material. The second material creates a second stress in the substrate material such that a net stress in the first region of stress in the substrate material is substantially zero. The first stress may alternatively be configured in the first material to obtain predetermined net stress characteristics other than zero.

In accordance with another embodiment of the present invention, a first material is provided. The first material can comprise a base substrate, or an intermediate layer in a multilayer structure. A first region of stress is configured at or near at least a portion of the surface of the first material to define a first stress profile having first stress characteristics. The first stress characteristics may include for example, magnitude and direction components. Moreover, the first stress characteristics can vary across the first region of stress. A layer of a second material is subsequently placed over the first material causing a second stress profile having second stress characteristics between the first and second materials. The first and second stress profiles combine resulting in a desired net stress profile having desired net stress characteristics.

For example, the first stress characteristics may be configured, to include a first magnitude of stress that is generally equal to a second magnitude of stress defined by the second stress profile. Under this arrangement, where the first stress characteristics are generally opposite the second stress characteristics, the net stress in the multilayer material structure is substantially zero. The first stress characteristics in the substrate material can also be chosen such that the net stress profile of the multilayer material structure after applying the second material defines a desired net stress having desired net stress characteristics.

Moreover, depending upon the particular application, a second region of stress can be configured at or near at least a portion of the surface of the second material to define a third stress profile having predefined, third stress characteristics. After defining the second region of stress, the second material is joined to the first material such that the first and second materials are in intimate contact. The first and second regions of stress may align in register, overlap, partially overlap, or avoid overlapping, depending upon the particular application and the net stress profile that is desired.

As used herein, the term "stress" includes internal or interfacial stresses in materials.

In another embodiment of the present invention, a method of creating a multilayer material structure is provided comprising configuring a region of stress within a first material, and depositing a layer of a second material over the substrate material. The second material is selected to create a multilayer material structure having a region of stress at a predetermined level of net stress in the first material. Stress may be configured in the second material to control the net stress as well.

In yet another embodiment of the present invention, a method of creating a multilayer material structure is provided comprising providing a substrate material, exposing the substrate material to a laser, configuring a region of stress in the substrate material, and depositing a layer of a second material on the substrate material. The second material is selected to create a stress at the surface of the substrate material that is opposite to the configured stress thereby creating a multilayer material structure having a net stress of substantially zero in the multilayer structure. Alternatively, the region of stress created by the laser can be configured to correspond oppositely to the effects of stress induced by joining the second material to the substrate.

In another embodiment of the present invention, a method of creating a multilayer material is provided comprising providing a substrate material, configuring a region of stress in the substrate material, and depositing a second material over the substrate material. The region of stress has a controlled stress pattern allowing the multilayer material structure to assume predetermined shapes or curvatures.

Accordingly, it is an object of the present invention to provide economically efficient methods for controlling the stress between dissimilar materials that have been bonded or joined without the need for chemical modification of the materials or the use of extra coatings and/or layers. It is an object of the present invention to provide methods of creating a multilayer material wherein stress is configured in a substrate material and a layer of a second material is placed into contact with the substrate material. The second material and configured stress are selected to induce a joining stress opposite to each other, thereby providing a multilayer material structure with a net stress at substantially zero. Alternatively, the second material and configured stress can be configured to provide a net stress at some predetermined level thereby allowing versatility in the placement of the materials and in the types of materials used.

DETAILED DESCRIPTION

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that logical, mechanical and electrical changes may be made without departing from the spirit and scope of the present invention.

The present invention provides methods of controlling the stress between two materials by mechanically configuring the stress in at least one layer of a first and second material, and then placing the second material in contact with the first material. For example, stress may be configured in the first material to have a stress opposite the stress between the first and second materials created as a result of the formation of the multilayer structure, to provide a controlled engineered stress at a predetermined level. For example, the configured stress between the two materials may be controlled such that a net stress is substantially zero or some other predetermined level.

Figure 2A:
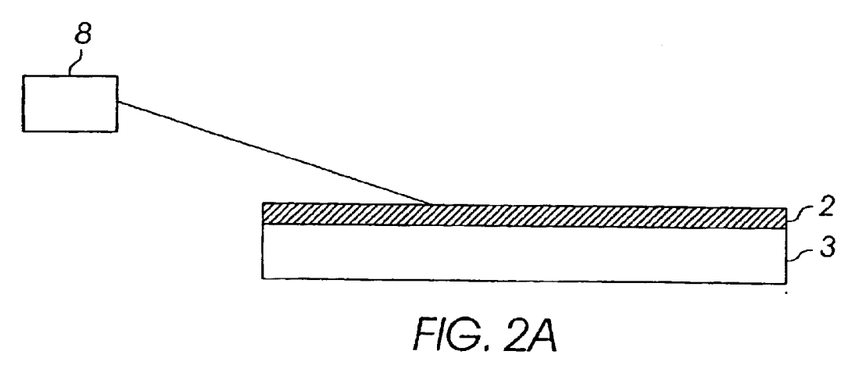
FIG. 2A is a schematic illustration of a substrate material with a configured stress region.
Figure 2B:
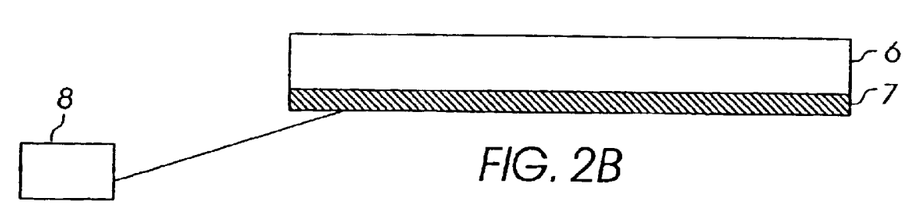
FIG. 2B is a schematic illustration of an intermediate material with a configured stress region.

Referring to FIG. 2A, an instrument 8 is used to create a region of stress 2 on a first material 3. For example, the first material 3 may be a base substrate of a multilayer structure. The instrument 8 basically configures a first stress profile having first stress characteristics on or near the surface of the first material 3. The first stress need not be uniform over the entire region of stress 2. The region of stress 2 may comprise the entire surface of the substrate material 3, or a part thereof. Referring to FIG. 2B, the instrument 8 may also be used to configure a region of stress 7 on a layer of a second material 6 in a manner analogous to that described above.

Figure 3:
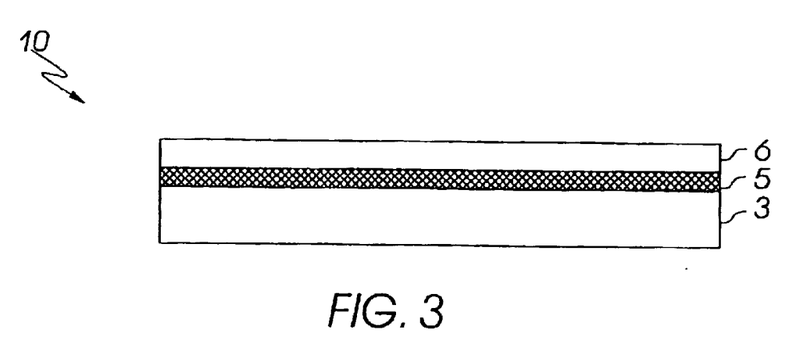
FIG. 3 is an illustration of the multilayer material having a net stress region of substantially zero.

Referring to FIG. 3, the layer of a second material 6 is formed on the substrate material 3. The bonding of the second material 6 to the first material 3 leads to the creation of additional stress, also referred to herein as a second stress profile, having second stress characteristics between the first and second materials 3, 6. This arrangement allows the engineering of specific, desired net stress profiles having predetermined net stress characteristics.

For example, the first stress profile in the region of stress 2 may be configured such that the second stress profile that results from joining the first and second layers 3, 6 is opposite the first, originally configured stress in the region of stress 2. The opposite stress profile of the second material 6 creates a net stress region 5 in the multilayer material structure 10 that is zero or substantially zero. The net stress is a function of the first and second stresses. As such, the first stress can be configured to achieve any desired net stress characteristics. Of course, the region of stress may be applied to the first material 3, the second material 6, or both. Where a stress region is applied to each of the first and second materials, then the net stress profile would be a function of the stress profiles contributed from the stress regions as well as the stress profile contributed by joining the first and second materials 3, 6.

Treatment using the instrument 8 may be repeated on the surface of the second material 6 to control any stress therewith, or to prepare the second material 6 to accommodate stresses expected from the deposition of a third material. This process can be repeated for as many layers as are in the multilayer structure and as necessary for a given application.

Any materials where stress can be induced and configured can be used with the various embodiments of the present invention herein. For example, the instrument 8 can be used to create a region of stress in any metal, polymer, or ceramic, including composite or compound mixtures thereof. The configured stress can be of any type but is generally compressive or tensile. Also, the stress can be configured in both the first and second materials, thereby providing more versatility. For example, in devices having rotating parts, compressive radial and hoop stresses can be induced to offset tensile stresses created by centrifugal motion.

The net stress profile may be substantially zero or, configured to achieve a predetermined degree of stress. The net stress may also be of any type but is generally compressive, tensile, or shear. In addition, the depth of the first, induced stress in the first material can be controlled to cancel mismatched stresses over a predetermined thickness or throughout the entire thickness of the materials as desired.

The first stress may be configured for example, by a laser as device 8 which can be used at any wavelength from the infrared to the ultraviolet and of any pulse frequency and power as required for the magnitude and the sign of the stress to be induced. The power of the laser, the wavelength, and pulse duration are chosen such that the interaction of the laser with the material causes some amount of atomic level rearrangement in the material. For example, use of high energy densities will typically ablate or vaporize material locally while more gentle treatment causes partial annealing in the surface and near-surface region. Depending on the precise level of stress required, and the physical properties (thermal conduction etc.) of the materials, a wide range of conditions may be used. Stresses to be induced by the laser can result from local melting and re-solidification or from shock waves induced in the material. While a laser is discussed as the means for configuring stress in the materials, it is to be appreciated that the stress can be configured in the material by any means that will provide a stress in a material, including for example, atomic force microscope tips, sharp tips, and electron beams.

It may be difficult under certain circumstances to measure surface and near surface stress. Such may be desirable when attempting to construct a region of stress to obtain a particular net stress profile. One approach useful for investigating stress and structural changes of a material due to laser machining is to use a technique such as micro-Raman spectroscopy. Basically, Raman light scattering is used to measure the induced stress and monitor the structural changes to the materials.

The internal stress that is configured in the materials is controlled by the power, wavelength, and pulse frequency of the instrument inducing the stress. The exact power, wavelength, and pulse frequency that is used depends upon the type of material that the laser is configuring, the stress, and the amount of stress that is desired to be configured in the material. Any amount of stress that is desired can be configured in the first material in order to create a final internal net stress that is at a predetermined value when the first material is joined or bonded to a second material. One possible application is to configure the induced first stress to a first value that is generally the opposite of the internal stress expected between the first and second materials. The techniques herein may be repeated for any number of materials in a multilayer structure.

Figure 4:
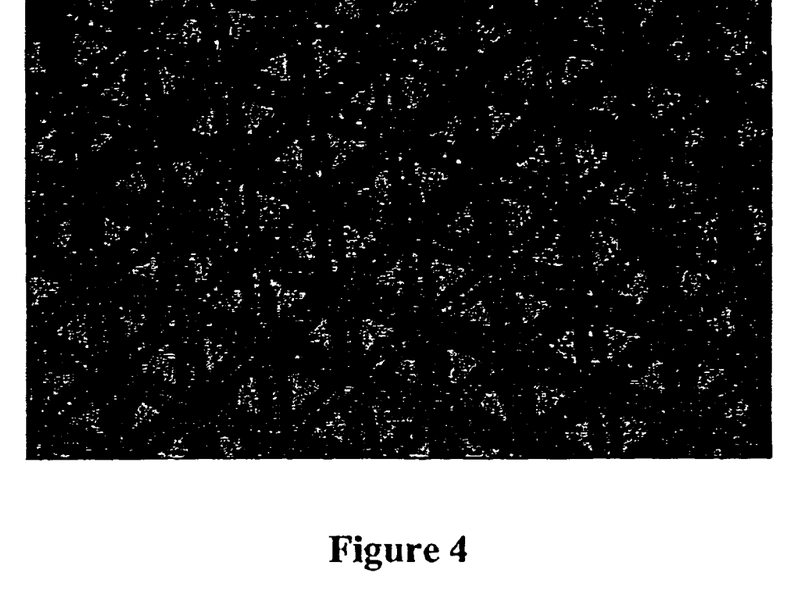
FIG. 4 is an optical micrograph showing a hexagonal pattern of 7 µm grooves in a silicon wafer.
Figure 5:
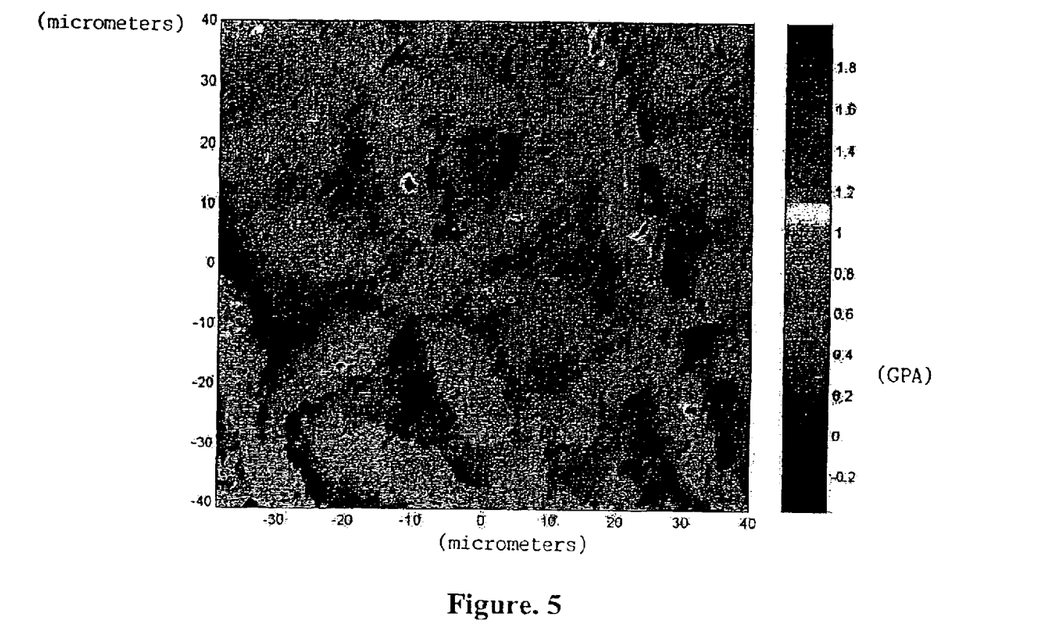
FIG. 5 is a Raman map of the stress configured in a single crystal silicon substrate due to the pattern shown in FIG. 4.
Figure 6A:
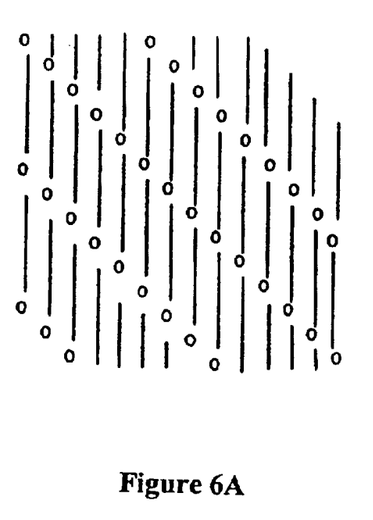
FIGS. 6a and 6b is an illustration of nanoscopic and/or microscopic patterns that may be used to create controlled stress fields.
Figure 6B:
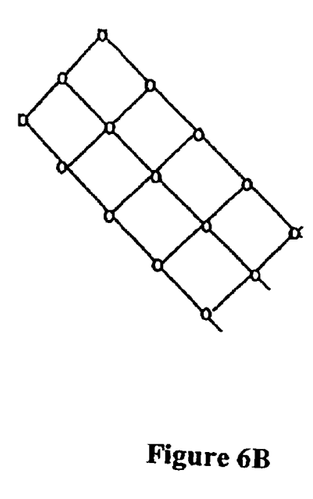

Referring to FIGS. 4–6, the configured stress profiles can be in any practical form, including controlled stress patterns such as small grooves, trenches, or voids that are of microscopic dimension in the materials to allow the materials to assume predetermined shapes. Such patterns may be linear or curved as desired. The exemplary pattern shown in FIG. 4 is a representation of the output of an optical micrograph showing a hexagonal pattern of 7 $\mu$m grooves in a silicon wafer. The result was produced by using a UV laser with 283 nm wavelength running at 30 $\mu$J per pulse at one hundred pulses per second. The laser was projected on a single-crystal silicon wafer and produced 1.2 GPa of tensile stress in the single crystal silicon.

The lines typically have a length on the order of approximately a few nanometers, however, the application will dictate the dimensions of the object being treated. The depth and the width of such trenches can be configured to yield the desired level of stress and curvature or deformation. The voids may have depth between about few nanometers to about few microns and a width between about few nanometers to about few microns. The trenches, voids, or combinations thereof can be used to create patterns on a surface to induce pre-determined and engineered stress fields in the material. Such stress fields can be, on a meso-scale, working in a fashion analogous to stress fields induced by dislocations and grain boundaries on an atomic scale. FIG. 5 is an illustration of a micro-Raman map of the stress configured due to the patterning illustrated in FIG. 4. FIGS. 6A and 6B illustrate additional examples of possible patterns useful for creating stress profiles.

The second material can be placed into contact with the first material using any number of known methods, including conventional and/or vacuum based deposition methods, such as CVD, sputtering, PLD, or Molecular Beam Epitaxy (MBE). The second material can be deposited on the substrate material at any temperature and for any period of time. However, under certain conditions, it may be desirable to apply the second material in a manner that does not allow the configured stress in the substrate material to relax.

The method of the present invention can be applied to manufacturing processes for systems such as integrated circuits, electronic boards, thin films and coatings created by PLD, CVD, MBE, thermal barrier coatings, wear resistant coatings, chemical resistant coatings, and any systems of interfaced dissimilar materials that result in products with high values of stresses.

For example, a part in a high bypass turbofan engine, of the sort used in aircraft, marine, or power generation applications, may be treated to induce a certain level of stress. Then a thermal barrier coating (TBC) may be applied. The induced stress in the substrate may be canceled by the stress induced due to the deposition of TBC. The TBC may then be treated by laser to induce stresses canceling the stresses induced by the deposition process. The process may be repeated for several layers of coatings.

Another example of the application of the method in one embodiment of the present invention is to engineer the response of optical surfaces to produce the required optical properties of large optical devices. A thin film of any material may be treated with different patterns of laser machined grooves and holes to produce a local pattern that conforms to pre-designed stress fields. The thin film may assume specific shape based upon the exact shape and value of the induced stress fields that should be achieved in the component. The stress fields may be calculated using various techniques to achieve the required values so that the materials will assume different shapes.

PROPHETIC EXAMPLE 1

A (111) single crystal p-type silicon wafer can be obtained from Crysteco, Wilmington, Ohio. The wafer can be machined on a UV micro-machining workstation. The UV micro-machining workstation uses a small pulsed excimer laser operating at 248 nm and running at 30 µJ per pulse at 100 pulses a second which will create a tensile stress in the silicon wafer ranging between 0.8 GPa and 1.4 GPa. The silicon wafer may be configured under the focused beam to machine grooves.

A material such as copper-nickel alloy (or any other metallization alloy) can be deposited onto the micromachined single crystal p-type silicon wafer. The copper-nickel alloy may cause a residual compressive stress ranging between −0.8 GPa and −1.4 GPa in the silicon substrate. Therefore, when the copper-nickel alloy is placed over the silicon wafer (referred to as metallization process), a net stress of substantially zero may be produced in the silicon substrate.

Having described the invention in detail and by reference to preferred embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method of controlling the stress caused when forming a multilayer structure comprising:
   providing a first material;
   inducing stress by patterning said first material with an instrument to cause some amount of atomic level rearranging in said first material such that said first material exhibits a first stress profile without changing the composition of said first material;
   forming a second material over and in contact with said first material, a second stress profile being defined therebetween such that a net stress profile results between said first and second materials that is a function of said first and second stress profiles, wherein said first stress profile is configured in a specific manner so as to achieve a desired net stress profile.

2. The method according to claim 1, wherein said first stress profile is configured in a specific manner to achieve a predetermined net stress that is approximately zero.

3. The method according to claim 1, wherein said first stress profile is configured so as to be generally equal in magnitude, but opposite of the second stress profile such that said net stress profile is substantially zero.

4. The method according to claim 1, wherein said first and second materials are dissimilar.

5. The method according to claim 1, wherein said instrument is selected from the group consisting of a laser, an atomic force microscope tip, a sharp tip and an electron beam.

6. The method according to claim 1, wherein said instrument causes said atomic level rearranging in said first material such that said first material exhibits said first stress profile using a high energy density that ablates material locally.

7. The method according to claim 1, wherein said instrument induces said stresses using local melting and re-solidification.

8. The method according to claim 1, wherein said instrument uses shock waves to induce said first stress.

9. The method according to claim 1, wherein said instrument comprises a laser and said first stress profile is controlled by adjusting at least one of power, wavelength, and pulse frequency of said instrument.

10. The method according to claim 1, where said instrument configures said first stress profile by creating at least one of voids, grooves and trenches on said surface of said first material.

11. The method according to claim 1, wherein said first material comprises at least one of a polymer and a ceramic.

12. The method according to claim 1, wherein said first material comprises a metal.

13. The method according to claim 1, wherein said first stress profile is configured to exhibit a depth that is controlled to cancel mismatched stresses over a predetermined thickness.

14. The method according to claim 1, wherein said first stress profile comprises controlled stress patterns having predetermined shapes arranged to achieve said desired net stress profile.

15. A method of controlling the stress caused when forming a multilayer structure comprising:
   providing a first material defining a substrate;
   inducing stress by patterning said first material with an instrument to cause some amount of atomic level rearranging in said first material to provide a first region of stress in said first material having first stress characteristics without changing the composition of said first material; and
   depositing a layer of a second material over said first material such that said first region has a net stress having net stress characteristics different from said first stress characteristics.

16. The method according to claim 15, wherein said instrument is selected from the group consisting of a laser, an atomic force microscope tip, a sharp tip and an electron beam.

17. The method according to claim 15, wherein said instrument comprises a laser and said first region of stress is configured by adjusting at least one of power, wavelength, and pulse frequency of said instrument.

18. The method according to claim 15, wherein said net stress characteristics comprises a magnitude of stress that is substantially zero.

19. The method according to claim 15, wherein:
   a second stress having second stress characteristics is provided upon depositing said second material over said first material;
   said net stress is a function of said first and second stresses; and
   said first stress is selected such that said net stress is set to a predetermined stress having predetermined stress characteristics.

20. A method of controlling the stress caused when forming a multilayer structure comprising:
   providing a substrate material;
   inducing stress by patterning said substrate material with an instrument to cause some amount of atomic level rearranging in said first material to configure a first stress profile in a region of stress on said substrate material without changing the composition of said substrate material, wherein said region of stress is defined by controlled stress patterns having predetermined shapes; and
   depositing a second material over said substrate material, where a second stress profile is defined between said substrate and said second material; wherein a net stress profile results as a function of said first and second stresses, said net stress profile having predetermined net stress characteristics adjusted by said controlled stress patterns.

21. The method according to claim 20, wherein said first stress profile is defined by at least one of a compressive and a tensile stresses.

22. The method according to claim 20, wherein said net stress comprises at least one of compressive, tensile and sheer stresses.

* * * * *

UNITED STATES PATENT AND TRADEMARK OFFICE
CERTIFICATE OF CORRECTION

PATENT NO. : 6,893,986 B2 Page 1 of 1
DATED : July 22, 2003
INVENTOR(S) : Amer et al.

It is certified that error appears in the above-identified patent and that said Letters Patent is hereby corrected as shown below:

Column 8,
Line 58, ""rearranging in said first material to configure" should read -- rearranging in said substrate material to configure --.

Signed and Sealed this

Thirtieth Day of August, 2005

JON W. DUDAS
*Director of the United States Patent and Trademark Office*

UNITED STATES PATENT AND TRADEMARK OFFICE
CERTIFICATE OF CORRECTION

PATENT NO.    : 6,893,986 B2
DATED         : July 22, 2003
INVENTOR(S)   : Amer et al.

It is certified that error appears in the above-identified patent and that said Letters Patent is hereby corrected as shown below:

Column 7,
Line 65, "said first stress." should read -- said stress. --.

Signed and Sealed this

First Day of November, 2005

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,893,986 B2 |
| APPLICATION NO. | : 10/624427 |
| DATED | : July 22, 2003 |
| INVENTOR(S) | : Amer et al. |

It is certified that error appears in the above-identified patent and that said Letters Patent is hereby corrected as shown below:

<u>Column 7,</u>
Line 65, "said first stress." should read -- said stress. --.

<u>Column 8,</u>
Line 58, "rearranging in said first material to configure" should read -- rearranging in said substrate material to configure --.

This certificate supersedes Certificate of Correction issued August 30, 2005 and November 1, 2005.

Signed and Sealed this

Twenty-seventh Day of June, 2006

JON W. DUDAS
*Director of the United States Patent and Trademark Office*

UNITED STATES PATENT AND TRADEMARK OFFICE
CERTIFICATE OF CORRECTION

PATENT NO.       : 6,893,986 B2
APPLICATION NO.  : 10/624427
DATED            : May 17, 2005
INVENTOR(S)      : Amer et al.

It is certified that error appears in the above-identified patent and that said Letters Patent is hereby corrected as shown below:

Column 7,
Line 65, "said first stress." should read -- said stress. --.

Column 8,
Line 58, "rearranging in said first material to configure" should read -- rearranging in said substrate material to configure --.

This certificate supersedes Certificate of Correction issued August 30, 2005, November 1, 2005 and June 27, 2006

Signed and Sealed this

Twenty-ninth Day of August, 2006

JON W. DUDAS
*Director of the United States Patent and Trademark Office*